US009966458B2

(12) United States Patent
Göhler et al.

(10) Patent No.: US 9,966,458 B2
(45) Date of Patent: May 8, 2018

(54) SPIN FILTER DEVICE, METHOD FOR ITS MANUFACTURE AND ITS USE

(71) Applicants: Westfälische Wilhelms Universität Münster, Münster (DE); Yeda Research and Development Co. Ltd. at the Weizmann Institute of Science, Rehovot (IL)

(72) Inventors: Benjamin Göhler, Münster (DE); Volker Hamelbeck, Kleve (DE); G. Friedrich Hanne, Münster (DE); Helmut Zacharias, Havixbeck (DE); Ron Naaman, Yarkona (IL); Tal Zvi Markus, Kfar Truman (IL)

(73) Assignees: Westfälische Wilhelms Universität Münster, Munster (DE); Yeda Research and Development Co. Ltd. at the Weizmann Institute of Science, Rehovot (IL)

( * ) Notice: Subject to any disclaimer, the term of this patent is extended or adjusted under 35 U.S.C. 154(b) by 0 days. days.

(21) Appl. No.: 15/178,951

(22) Filed: Jun. 10, 2016

(65) Prior Publication Data

US 2016/0293741 A1    Oct. 6, 2016

Related U.S. Application Data

(62) Division of application No. 13/365,706, filed on Feb. 3, 2012, now Pat. No. 9,391,285.

(30) Foreign Application Priority Data

Feb. 3, 2011 (GB) .................................. 1101862.9

(51) Int. Cl.
| H01L 29/66 | (2006.01) |
| B82Y 10/00 | (2011.01) |
| H01L 51/00 | (2006.01) |
| H01L 51/05 | (2006.01) |

(52) U.S. Cl.
CPC ........ H01L 29/66984 (2013.01); B82Y 10/00 (2013.01); H01L 51/0093 (2013.01); H01L 51/0595 (2013.01)

(58) Field of Classification Search
None
See application file for complete search history.

(56) References Cited

U.S. PATENT DOCUMENTS

| 5,472,881 A | 12/1995 | Beebe et al. |
| 9,391,285 B2 | 7/2016 | Göhler et al. |
| 2003/0022227 A1 | 1/2003 | Nakamura et al. |

(Continued)

OTHER PUBLICATIONS

Ray et al. ("Chirality-Induced Spin-Selective Properties of Self-Assembled Monolayers of DNA on Gold," Physical Review Letters, vol. 96, No. 3, 2006, p. 036101-1 to 036101-4).*

(Continued)

*Primary Examiner* — Angel Roman
*Assistant Examiner* — Kevin Quinto
(74) *Attorney, Agent, or Firm* — Schwegman Lundberg & Woessner, P.A.

(57) ABSTRACT

The present invention relates to a method and a device for providing a current of spin-polarized electrons. More particularly, the present invention is suited for use in spin electronics or detection of spin-polarized electrons.

18 Claims, 10 Drawing Sheets

(56) References Cited

U.S. PATENT DOCUMENTS

| | | | |
|---|---|---|---|
| 2004/0147031 A1* | 7/2004 | Nakao | B82Y 15/00 436/63 |
| 2004/0151907 A1* | 8/2004 | Naoi | H01G 9/155 428/402 |
| 2005/0100930 A1 | 5/2005 | Wang et al. | |
| 2007/0287015 A1 | 12/2007 | Naaman et al. | |
| 2008/0161202 A1 | 7/2008 | Cabezas et al. | |
| 2009/0057793 A1 | 3/2009 | Koga | |
| 2012/0223294 A1 | 9/2012 | Göhler et al. | |

OTHER PUBLICATIONS

Nogues et al. ("Electrical properties of short DNA oligomers characterized by conducting atomic force microscopy," Physical Chemistry Chemical Physics, vol. 6, No. 18, 4459, published on the internet on Aug. 20, 2004, p. 4459-4466).*

"U.S. Appl. No. 13/365,706, Advisory Action dated Apr. 30, 2015", 3 pgs.

"U.S. Appl. No. 13/365,706, Final Office Action dated Feb. 12, 2015", 11 pgs.

"U.S. Appl. No. 13/365,706, Non Final Office Action dated Jul. 16, 2014", 12 pgs.

"U.S. Appl. No. 13/365,706, Non Final Office Action dated Sep. 10, 2015", 13 pgs.

"U.S. Appl. No. 13/365,706, Non Final Office Action dated Dec. 20, 2013", 10 pgs.

"U.S. Appl. No. 13/365,706, Notice of Allowance dated Mar. 11, 2016", 7 pgs.

"U.S. Appl. No. 13/365,706, Response filed Mar. 20, 2014 to Non Final Office Action dated Dec. 20, 2013", 12 pgs.

"U.S. Appl. No. 13/365,706, Response filed Apr. 13, 2015 to Final Office Action dated Feb. 12, 2015", 11 pgs.

"U.S. Appl. No. 13/365,706, Response filed Jun. 12, 2015 to Final Office Action dated Feb. 12, 2015", 11 pgs.

"U.S. Appl. No. 13/365,706, Response filed Jul. 16, 2013 to Restriction Requirement dated Jun. 6, 2013", 7 pgs.

"U.S. Appl. No. 13/365,706, Response filed Oct. 16, 2014 to Non Final Office Action dated Jul. 16, 2014", 14 pgs.

"U.S. Appl. No. 13/365,706, Response filed Nov. 26, 2013 to Restriction Requirement dated Nov. 8, 2013", 10 pgs.

"U.S. Appl. No. 13/365,706, Response filed Dec. 8, 2015 to Non Final Office Action dated Sep. 20, 2013", 9 pgs.

"U.S. Appl. No. 13/365,706, Restriction Requirement dated Jun. 6, 2013", 6 pgs.

"U.S. Appl. No. 13/365,706, Restriction Requirement dated Nov. 8, 2013", 9 pgs.

"European Application No. 12153747.6, European Search Report dated Jul. 7, 2014", (dated Jul. 7, 2014), 8 pgs.

"European Application No. 12153747.6, Response filed Jan. 28, 2015", 17 pgs.

Carmeli, I., et al., "Magnetization of Chiral Monolayers of Polypeptide: A Possible Source Magnetism in Some Biological Membranes", Angew. Chem., 114(5), (2002), 787-790.

Göhler, "Spin Selectivity in Electron Transmission Through Self-Assembled Monolayers of Double-Stranded DNA", Science, vol. 331, www.sciencemag.org, (Feb. 18, 2011), 894-897.

Nogues, C., et al,, "Electrical properties of short DNA oligomers characterized by conducting atomic force microscopy", Physical Chemistry Chemical Physics, 6(18), (2004), 4459-4466.

Ray, K., et al., "Asymmetric Scattering of Polarized Electrons by Organized Organic Films of Chiral Molecules", Science, 283(5403), (1999), 814-816.

Ray, S. G., et al., "Chirality-Induced Spin-Selective Properties of Self-Assembled Monolayers of DNA on Gold", Physical Review Letters, 96(3), (2006), 036101-1-036101-4.

* cited by examiner

FIG. 11

SPIN FILTER DEVICE, METHOD FOR ITS MANUFACTURE AND ITS USE

CLAIM OF PRIORITY

This application is a divisional of and claims the benefit of priority to U.S. patent application Ser. No. 13/365,706, filed Feb. 3, 2012, which claims the benefit of priority under 35 U.S.C. § 119 (a)-(d) of Great Britain Patent Application Serial Number 1101862.9, entitled "SPIN FILTER DEVICE, METHOD FOR ITS MANUFACTURE AND ITS USE," filed on Feb. 3, 2011, the benefit of priority of which is claimed hereby, and which is incorporated by reference herein in its entirety.

TECHNICAL FIELD

The present invention relates to a method and a device for providing a current of spin-polarised electrons. More particularly, the present invention is suited for use in spin electronics or detection of spin-polarised electrons.

BACKGROUND

The generation of a current of spin-polarised electrons, in which all electron spins point mostly in the same direction, is a central aspect of spin electronics (hereafter also called spintronics). Spintronics, or spin electronics, refers to the role played by electron spin in solid state physics, and to devices that specifically exploit spin properties, i.e. spin degrees of freedom, instead of or in addition to, charge degrees of freedom. For example, spin relaxation and spin transport in metals and semiconductors are of interest in fundamental research such as solid state physics and more generally in other electronic technology areas. Extensive research and development is carried out in the field of spintronics with the objective to fully utilise the advantage that no electron charges need to be transported which would cost energy and produce heat.

To date, currents of spin-polarised electrons are predominantly obtained from magnetic or magnetized materials. When the spin has to be inverted the applied external magnetic field needs to be inverted. This is typically intrinsically slow to carry out, and would thus be inefficient for many applications.

Furthermore, currents of spin-polarised electrons can be obtained when circularly polarised light ejects electrons from substrates with large spin-orbit coupling, for example gallium arsenide (GaAs).

In the above mentioned methods, the materials used are prepared in complex preparations under ultra-high vacuum (UHV) conditions. Thus, their integration into large scale integrated circuits or even printed circuits is difficult.

An important attribute of free spin-polarised electrons is the degree of polarisation. The degree of polarisation of free spin-polarised electrons is presently measured by so called Mott scattering of high energy electrons on thin gold foil under high vacuum conditions. The high energy electrons are in the region of more than 50 kV and the thin gold foil is in the region of a few nanometers. Alternatively, the degree of polarisation of free spin-polarised electrons can be measured by spin-dependent diffraction at surfaces of wolfram (W) or iron (Fe) under ultra-high vacuum conditions (less than $10^{-10}$ mbar). However, both methods for detecting spin-polarised electrons are technically complex and prone to errors.

BRIEF SUMMARY OF THE INVENTION

The present invention provides a spin filter device with the features of claim 1, a method for manufacturing a spin filter device of claim 6 the use of a spin filter device of claim 9 and a spintronic transistor structure with the features of claim 15. Further dependent claims describe preferred embodiments.

It is one object of the present invention to provide a method and system which overcomes at least some of the problems relating to spin-polarised electrons.

It is thus an object of the present invention to provide a method and device for obtaining spin-polarised electrons which can be integrated and used in large scale integrated circuits, printed circuits and/or spintronic applications in general.

It is a further object of the present invention to provide a method and device for detecting spin-polarised electrons which can be employed without the need of complex and error-prone equipment.

It is a further object of the present invention to achieve high efficiency in spin selectivity.

According to an aspect of the present invention, there is provided a spin filter device including
  a substrate and
  at least one monolayer deposited upon said substrate;
wherein said monolayer comprises asymmetrical molecules, and is adapted to filter electrons travelling from said substrate through said at least one monolayer such that electrons that exhibit a predetermined spin can pass.

Optionally, the molecules of said at least one monolayer are chiral molecules. Chiral molecules lack mirror image symmetry and show two types of enantiomers that can be described as left-handed (L- or levo-) and right-handed (D- or dextro-) species. When a charge moves within a chiral system in one direction it creates a magnetic field as a result of so called broken mirror image symmetry.

Optionally, the substrate can be one of a metal or a semiconductor.

The substrate can optionally be polycrystalline or single crystalline. An example of the substrate suitable for the spin filter device of the present invention can include, but is not limited to, polycrystalline gold (Au) or single crystalline gold (Au(111)).

Optionally, the at least one monolayer can be self-assembled on the substrate, produced for example in a wet chemical procedure.

The said at least one monolayer can optionally comprise organic molecules.

Optionally, the said at least one monolayer can comprise nano-particles, particularly nano-dots.

The molecules of the said at least one monolayer can optionally be thiolated molecules. An example of the thiolated molecules suitable for the spin filter device of the invention can include, but is not limited to, double stranded DNA. Double stranded DNA is chiral both because of its primary structure and because of its secondary, double helix structure. The molecules can have a predetermined length, e.g. the double stranded DNA can comprise for example 26, 40, 50, 78 or any other number of base pairs (bp) as considered appropriate for particular application of the present invention.

According to an aspect of the invention, there is provided a method for manufacturing a spin filter device, the method including the steps of
  (a) providing a substrate;
  (b) depositing at least one monolayer upon the substrate;

wherein the at least one monolayer comprises asymmetrical molecules adapted to filter a current of electrons such that electrons that exhibit a predetermined spin can pass to generate a current of spin-polarised electrons.

The substrate and the at least one monolayer can include all or selected features of the substrate and the monolayer, respectively, and its preferred embodiments as defined in relation to the aspect of the invention further above in which a spin filter device is provided, as considered appropriate for manufacturing the spin filter device.

Step (a) of the method can optionally include cleaning the substrate prior to step (b), for example by sputtering with rare or reactive gases or by wet chemical agents.

Optionally, the at least one monolayer can be deposited upon the substrate by self-assembling of the molecules. The self-assembling of the molecules can optionally be processed in a wet chemical procedure.

Optionally, step (b) of the method can include integrating nano-particles, particularly nano-dots, into the at least one monolayer. If there is more than one monolayer, the nano-particles can optionally be integrated between the monolayers.

According to an aspect of the invention, there is provided a method for using a spin filter device for generating a current having a first substrate and at least one monolayer deposited on the first substrate, the method including the steps of
  (a) producing a current of electrons from the first substrate to travel into the at least one monolayer; and
  (b) injecting electrons which have passed the at least one monolayer into a second substrate;
wherein the at least one monolayer comprises asymmetrical molecules adapted to filter the current of electrons such that electrons that exhibit a predetermined spin can pass to generate a current of spin-polarised electrons.

Optionally, the first substrate is one of a metal or a semiconductor. The second substrate can optionally be one of a metal, a semiconductor, an isolator or a vacuum.

The at least one monolayer can include all or selected features of the monolayer and its preferred embodiments as defined in relation to the aspect of the invention in which a spin filter device is provided, as considered appropriate for using the spin filter device.

Optionally, step (a) of the method can include irradiating said substrate with photons from a photon source thereby producing a current of photoelectrons which travel into said at least one monolayer.

Optionally, step (a) of the method can include irradiating said substrate with a UV laser pulse. Optionally, a photon energy of the photoelectrons emitted by the UV laser can be 5.84 eV, wherein the pulse duration can be about 200 ps (picoseconds) at 20 kHz repetition rate, and a fluence of 150 pJ/cm$^2$. However, any other photon energy, pulse duration, repetition rate or fluence can be applied as appropriate. The laser pulse can optionally be generated from a Nd:YVO$_4$ oscillator.

Optionally, step (a) can be realised by electric or magnetic field induced injection from a spin polarised substrate.

Step (a) can optionally include irradiating said substrate with linearly or circularly polarised or unpolarised photons.

According to a further aspect of the present invention, there is provided a spintronic transistor structure including a semiconductor structure carrying a spin filter device including all or selected features of the spin filter device and its preferred embodiments as defined in relation to the aspect of the invention in which a spin filter device is provided, wherein the spin filter device is adapted to operate as a spin injector for the semiconductor structure.

Optionally, the semiconductor structure can comprise silicon or GaAs.

According to a further aspect of the present invention, there is provided a detector for spin-polarised electrons, the detector including at least one monolayer;
  wherein the monolayer is deposited upon the detector such that electrons to be detected have to pass the monolayer; and
  wherein the monolayer comprises asymmetrical molecules and is adapted to filter electrons such that electrons that exhibit a predetermined spin can pass.

Optionally, the molecules of the at least one monolayer are chiral molecules.

The said at least one monolayer can optionally comprise organic molecules. Optionally, the at least one monolayer is self-assembled on the detector, for example in a wet chemical procedure.

The at least one monolayer can optionally comprise nano-particles, particularly nano-dots.

An advantage of embodiments of the present invention is that magnetic or magnetized substrates are no longer needed to generate spin-polarised electrons. Also, circularly polarised light is no longer needed to generate spin-polarised electrons. The materials can be easily prepared, for example by wet chemical procedures, and have turned out to be stable in air. So, they can be used in room temperature and do not need expensive cooling. A further advantage of the present invention is that it provides an effective way to inject spin into standard transistors, such as silicon based transistor. The invention further enables spin sensitive gating. Furthermore the invention enables the reduction of the amount of space and heat capacitance of logic devices.

Another advantage of embodiments of the present invention arises from the fact that molecular scale electronics are used. This opens a way for incorporating the quantum mechanical spin concepts with a standard device such as those based on, for example silicon (Si) or gallium arsenide (GaAs). In molecular electronic devices, when trying to contact molecules to the macroscopic world, problems can be circumvented with the present invention. Embodiments of the present invention provide a viable alternative to the conventional schemes proposed for molecular electronics.

BRIEF DESCRIPTION OF THE DRAWINGS

Embodiments of the present invention will be described with reference to and as shown in the following Figures, in which.

DETAILED DESCRIPTION

Figure 1:
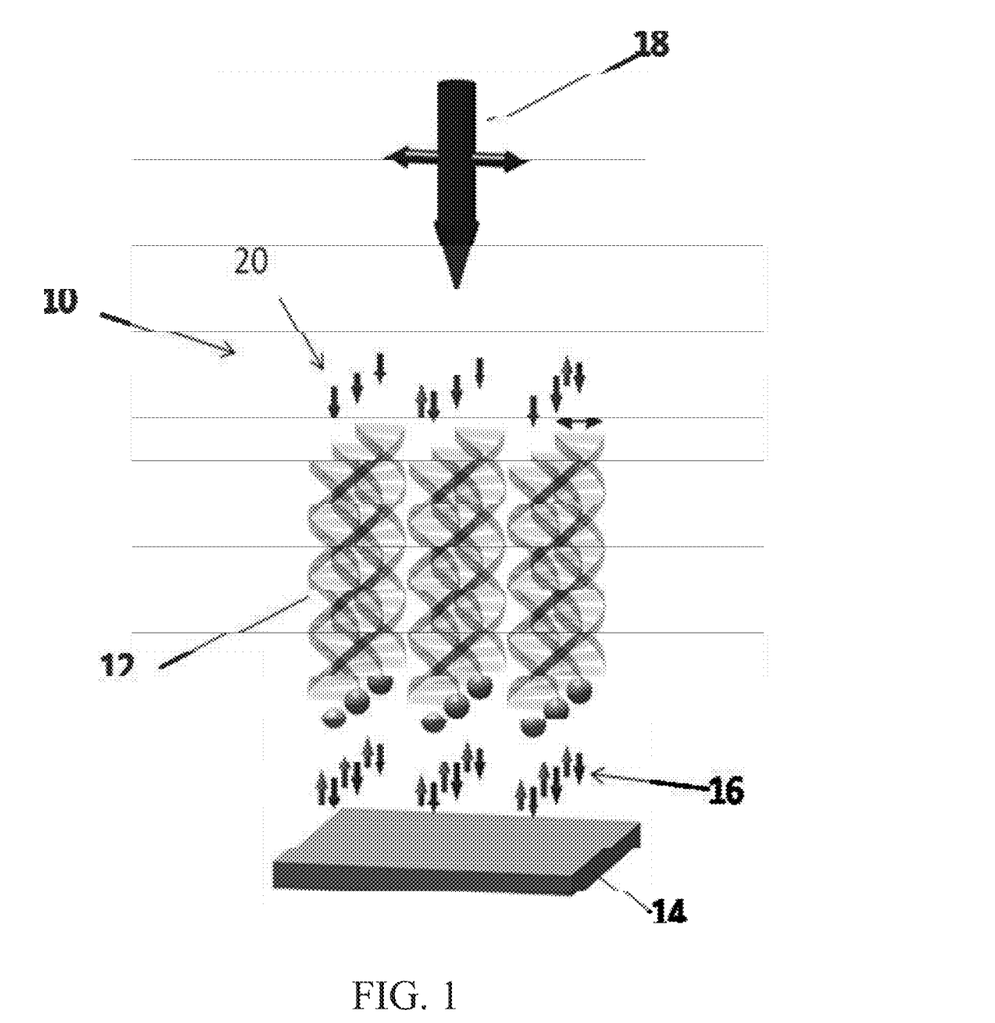
FIG. 1 is a perspective view of a spin filter device according to one embodiment of the present invention.

FIG. 1 shows a perspective view of a spin filter device 10 according to one embodiment of the invention. In this example, the spin filter device 10 includes a monolayer 12 of double stranded DNA (dsDNA). Thiolated dsDNA is bound to a substrate 14, which is a gold surface in this example, and forms a self-assembled monolayer 12 of chiral molecules. The substrate can also be formed by any other material, e.g. a different metal or a semiconductor. Unpolarised electrons 16 ejected from the gold surface produced by linearly polarised light 18 incident from the monolayer side are transmitted and can be analyzed. Most of the electrons 20 transmitted through the monolayer 12 are spin polarised. Spin orientation depends on the enantiomer used in the monolayer.

It is well known that spin-polarised photoelectrons are readily generated from magnetic substrates or when circularly polarised light ejects electrons from substrates with large spin-orbit coupling Since an organic chiral layer on a non-magnetic metal surface is not likely to be self-magnetized, one expects that photoelectrons ejected from such a layer with unpolarised light will not be spin polarised. The present invention however shows exceptionally high polarisation of electrons which are ejected from surfaces coated with self-assembled monolayer of double stranded DNA, independent of the polarisation of the incident light. It has previously been shown that the photoelectron yield from self-assembled monolayers of chiral molecules on gold depends on the circular polarisation of the exciting light as well as the voltage across the layer and its handedness. The spin polarisation of the electrons was not measured, and indications for spin-dependent transmission were only inferred from the dependence of the total electron yield on the circular polarisation of the incident photons. These studies could not determine whether or not the ejected electrons are spin polarised when the incident photons are unpolarised or linearly polarised. Furthermore, the observed effect may result from circular dichroism, namely that the absorption of the system depends on the light's circular polarisation.

In the present invention, self-assembled dsDNA monolayers can be prepared according to standard procedures by depositing dsDNA which is thiolated on one, e.g. the 3', end of one of the DNA strands on a clean gold substrate. Either polycrystalline Au or single crystal Au(111) may be used as substrates. The monolayers are characterized by various methods that ensure the uniformity and reproducibility of the DNA layer. The experiments have been carried out under ultra-high vacuum conditions that employed photoelectron detection with two detectors, an electron time-of-flight instrument, recording the kinetic energy distribution of the electrons, and a Mott-type electron polarimeter for spin analysis. The photoelectrons were ejected by a LTV laser pulse with a photon energy of 5.84 eV, pulse duration of about 200 ps at 20 kHz repetition rate, and a fluence of 150 pJ/cm$^2$. The laser light is normally incident onto the sample, and it is either linearly or circularly polarised. For the vast majority of DNA samples no damage is observed over the course of the spin polarisation measurement within about four hours. For direct polarisation measurements, the photoelectrons are guided by an electrostatic 90°-bender and subsequent transport optics. Hence, an initial longitudinal spin polarisation is converted into a tranversal one for analysis. In the electron polarimeter, an electron spin polarisation causes an up-down scattering asymmetry $A=(I_U-I_L)/(I_U+I_L)$. Here $I_{U,L}$ denote the count rates of an upper and a lower counter. The transversal polarisation is given by $P=A/S_{eff}$. The analysing power, also known as the Sherman function, has been calibrated to be $S_{eff}=-(0.229\pm0.011)$. In the above set-up, the spin polarisation parallel to the sample normal and thus parallel to the initial electron velocity is measured.

Figure 2A:
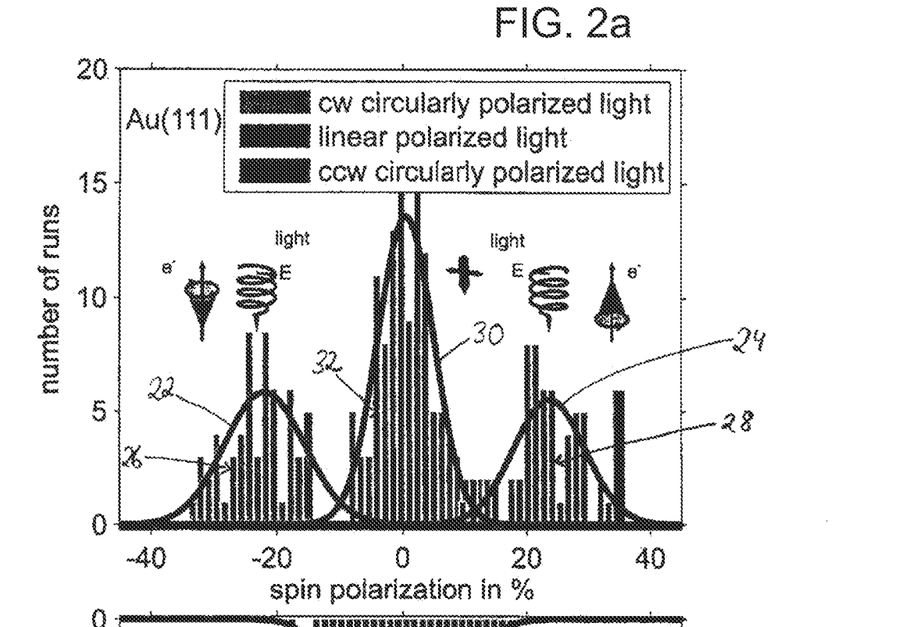
FIG. 2*a* shows a distribution of a spin polarisation percentage of electrons ejected from a clean substrate with linearly or circularly polarised light according to the prior art.
Figure 2B:
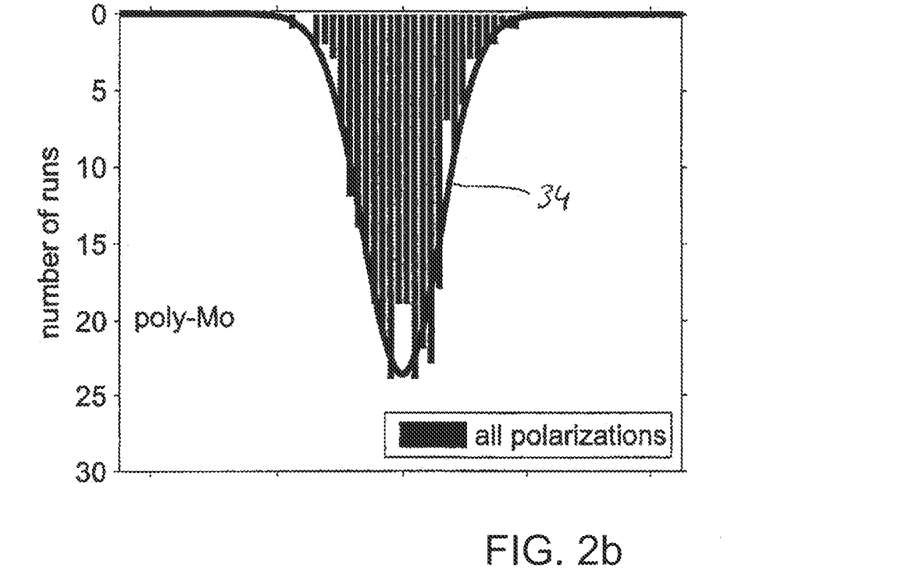
FIG. 2*b* shows a distribution of a spin polarisation percentage of electrons ejected from another bare substrate with linearly or circularly polarised light according to the prior art.

FIG. 2a and FIG. 2b illustrate examples of measurements of spin-polarisation with prior art devices. In FIG. 2a, the spin polarisation of photoelectrons from a clean Au(111) single crystal is shown for different laser polarisations. The spin polarisation and the sign of its orientation depend on the laser polarisation. The comparison of the counting rates in the upper and lower counter of the Mott polarimeter yields an intensity asymmetry of $A=\pm(5.03\pm1.1)\%$ for clockwise (cw, curve 22) and counter clockwise (ccw, curve 24) circularly polarised light. Combined with the Sherman function $S_{eff}$ average electron spin polarisations of $P=\mp(22\pm5)\%$ are determined for emission from the single crystal substrate, shown by the histograms 26, 28. For negative electron spin polarisation, the direction of the spin vector is antiparallel to the propagation direction of the electron, and correspondingly parallel to $\vec{k}$ for positive spin polarisation. As expected for an unmagnetized substrate, no asymmetry and therefore also no spin polarisation is observed for electrons ejected from the gold surface when the laser is polarised linearly (curve 30, histogram 32). For reference, the spin polarisation is shown for electrons emitted from the molybdenum sample holder in FIG. 2b. In this case, the spin polarisation is zero for circular as well as linear laser polarisation (curve 34). This signal has been used as a reference for the further experiments.

Figure 3A:
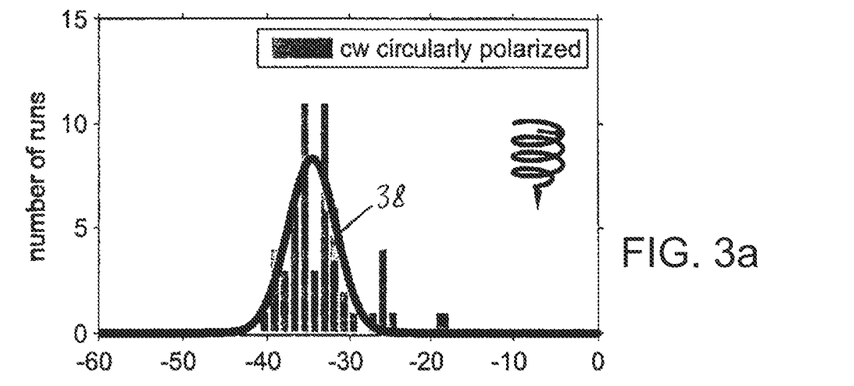
FIGS. 3*a*, 3*b*, 3*c* show a distribution of the spin polarisation percentage of electrons transmitted through a spin filter device according to an embodiment of the present invention, for light polarised clockwise circularly, linearly, and counter-clockwise (ccw) circularly, respectively.
Figure 3B:
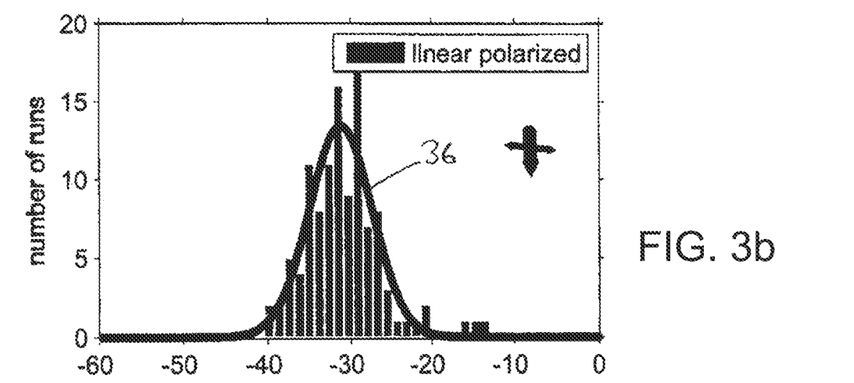
Figure 3C:
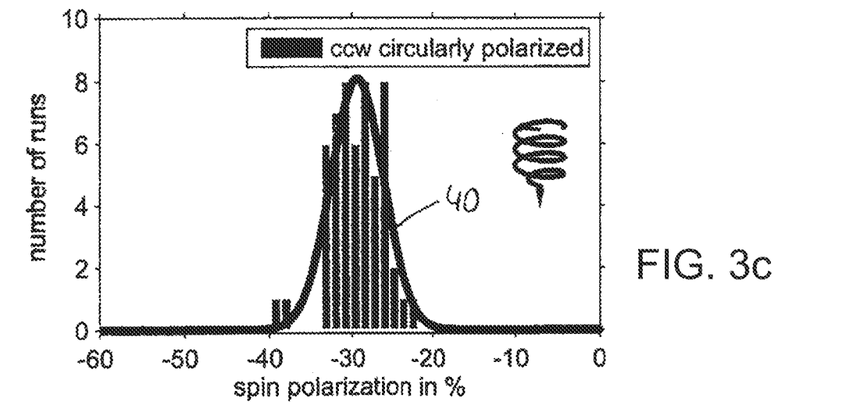

FIGS. 3a, 3b and 3c illustrate examples of measurements of spin-polarisation of spin filter device as shown in FIG. 1 according to an embodiment of the present invention. More specifically, FIGS. 3a, 3b and 3c show the spin polarisation observed when electrons from the same Au(111) single crystal are transmitted through a self-assembled monolayer of 50 base pairs (bp) dsDNA. Excitation with linearly polarised light (FIG. 3b) produces now strongly spin polarised electrons with an average P=−(31±4)% (curve 36). Also, excitation by clockwise (cw) (FIG. 3a) and counter-clockwise (ccw) (FIG. 3c) circularly polarised light yields spin polarised electrons with average polarisations of P=−(35±3)% and −(29±3)% (curves 38, 40), respectively. All electron spin polarisations show the same negative sign, independent of the light polarisation. A similar high spin polarisation is observed for linearly polarised light too (FIG. 3b, curve 36). These results stand in contrast to the case of the clean Au (111) substrate as shown in FIG. 2a, for which linearly polarised light induces no electron spin polarisation (curve 30), and for which the helicity of the circularly polarised light determines the direction of the electron spin polarisation.

These results indicate that the ordered monolayer 12 (FIG. 1) of dsDNA acts as a spin filter for electrons 16, 20 (FIG. 1) excited in the gold as substrate 14 (FIG. 1) and transmitted through the dsDNA monolayer 12.

Figure 4:
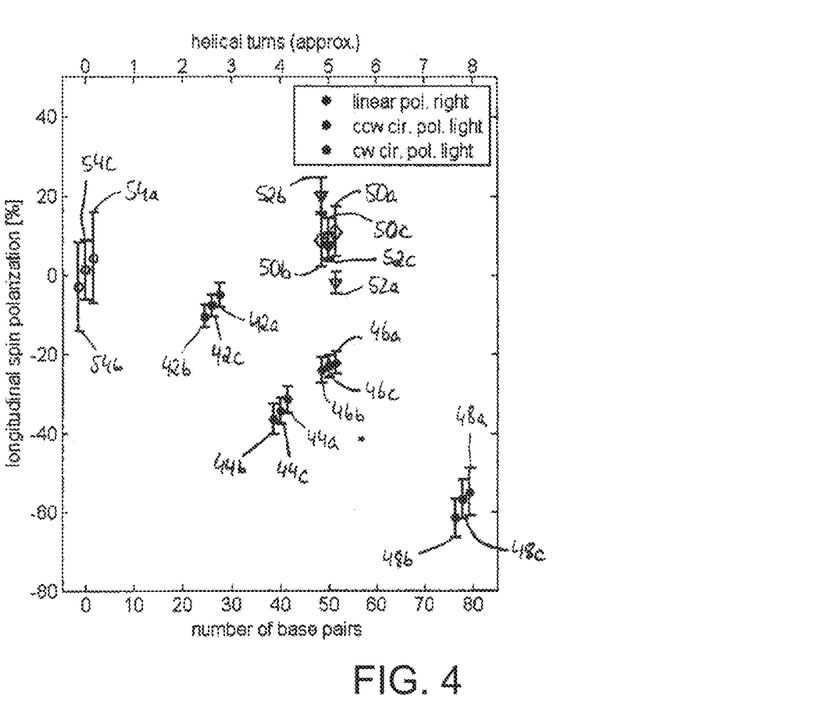
FIG. 4 shows the electron spin polarisation for spin filter devices according to the present invention and reference materials as a function of the length of chiral molecules.

FIG. 4 shows measurements of the electron spin polarisation for various monolayers 12 (FIG. 1) of DNA on polycrystalline gold (Au) surfaces. More specifically, room temperature electron spin polarisations are presented for four different monolayers of dsDNA in which each of the molecules have different lengths of 26, 40, 50, and 78 base pairs (line with filled dots shown at 42a,b,c, 44a,b,c, 46a,b,c, 48a,b,c). The results of 36 different experiments on ten different samples are shown. Further, monolayers of single stranded DNA (lines with open diamond shown at 50a,b,c), and a sample of dsDNA damaged by UV light (lines with open triangle shown at 52a,b,c) are investigated. Also the electron spin polarisation from an un-cleaned bare polycrystalline gold substrate (open circle 54a,b,c) is shown at zero base pairs. Measurements are conducted with light of different polarisations, cw (42a, 44a, 46a, 48a, 50a, 52a, 54a) and ccw (42b, 44b, 46b, 48b, 50b, 52b, 54b) circular, and linear (42c, 44c, 46c, 48c, 50c, 52c, 54c). For clarity, the symbols for the different light polarisations are off-set by a plus and minus one base pair. The data indicates that with increasing length of the dsDNA molecules the absolute value of electron spin polarisation increases. The highest electron spin polarisation is observed for 78 bp dsDNA with about P=−60% (shown at 48a,b,c). While for dsDNA on average the electron spin polarisation increases with the length of the DNA, no polarisation is obtained for single stranded DNA (shown at 50a,b,c). In an absolute value, the polarisation increases slightly in the case of dsDNA, when the electrons are injected with ccw circular polarised light (42b, 44b, 46b, 48b), because there are more electrons injected into the monolayer 12 with a $\pi$ polarisation that coincides with a high transmission of the monolayer 12. Given error bars are standard deviation of the mean of several runs, namely single measurements each having a statistical error of about less than 3%. Measurements performed on different samples coated with the same number of base pairs are averaged and the total error is calculated by error propagation.

The measurements presented in the Figures as described above indicate that well-organized self-assembled monolayers 12 of dsDNA on Au as substrate 14 act as very efficient spin filters. Within the range of dsDNA length studied, the selectivity increases with its length and therefore the number of turns of the helix. It is important to appreciate that even the longest molecules used are still shorter than the persistence length of the DNA, which is the length up to which the DNA behaves as a rigid rod. Hence, the dsDNA oligomers studied here are rigid and each monolayer 12 can be visualized as consisting of rigid chiral rods closely packed together, as depicted in FIG. 1. In the case of a monolayer made from single strand DNA, the molecules are more floppy and do not form rigid close-packed monolayers and indeed no spin selectivity is observed. Because the photon energy is lower than the ionization energy of the DNA and the laser intensity is low, the photoelectrons all originate from the gold substrate. In addition, less than 0.1% of the incident light is absorbed in the layer, even under resonance conditions. The low intensities and weak absorbances ensure further that non-linear excitation processes do not occur in the DNA layer.

Electrons are known to transmit through free standing or supported thin ferromagnetic films that acted as a spin filter in certain situations. In these cases, and for low-energy electrons, the selectivity was reported to be about 25%. The spin polarisation can be explained by inelastic electron scattering involving unoccupied d-states above the Fermi level. The scattering rate for minority spin electrons is then enhanced with respect to that of majority spin electrons because of an excess of minority spin holes. The polarisation decreased sharply as a function of collision energies, due to the spin dilution by secondary electrons. However, in the present invention the polarisation is energy independent within the energy range studied. Although polarised light is not needed, the polarisation achieved with embodiments of the present invention is almost as high as that obtained by photoemission with circular polarised light from GaAs substrates.

The mechanism of how charge transport or charge redistribution through chiral systems generates a magnetic field is elementary; however, this magnetism is transient, ending when the charge flow stops. A possible way to transform transient charge flow into permanent magnetism is by spin-orbit coupling that converts the orbital angular momenta of the electrons in the helical potential into spin alignment. Spin-orbit coupling in hydrocarbons is commonly believed to be very weak and therefore no significant spin alignment is expected. Indeed, the interaction of spin polarised electrons with chiral molecules has earlier been studied. When these electrons were scattered from gas phase and thus randomly oriented chiral molecules, only a very small preference of the order or $10^{-4}$ of one spin orientation over the other was found, and only when a heavy metal atom with significant spin-orbit interaction was present in the molecules. In contrast to these gas phase studies, electrons transmitted through organized monolayers of dipolar-chiral molecules of the present invention display a large dependence on the handedness of the molecules.

Figure 5:
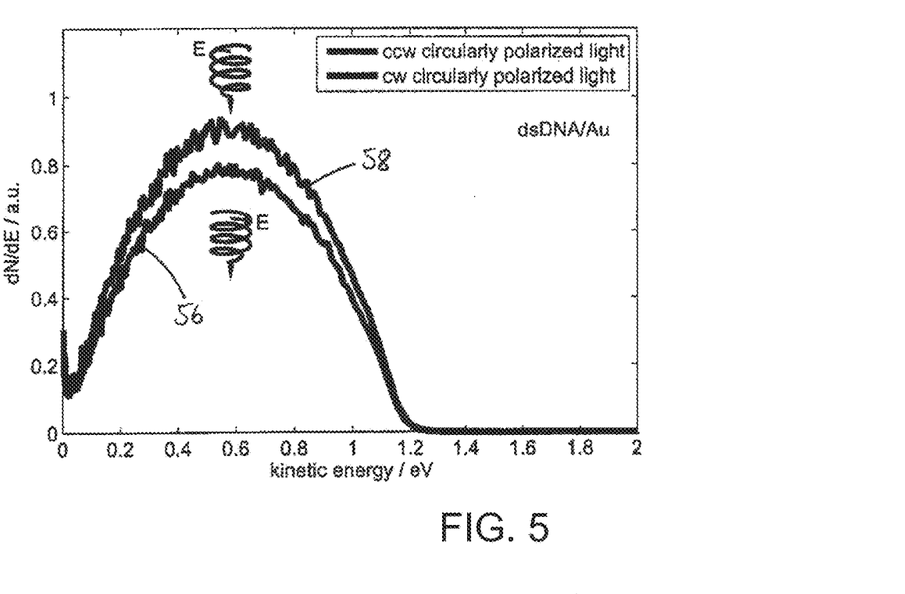
FIG. 5 shows a total photoelectron signal measured for electrons ejected from a spin filter device according to the present invention applying clockwise (cw) and counter-clockwise (ccw) polarised light.

FIG. 5 shows the kinetic energy distribution of the electrons 16, 20 (FIG. 1) transmitted through the self-assembled monolayer 12 (FIG. 1) of dsDNA (50 bp) adsorbed on a polycrystalline Au substrate 14 (FIG. 1) for clockwise (cw, curve 56) and counter clockwise (ccw, curve 58) circularly polarised light. Photoelectrons with kinetic energies up to about 1.2 eV are measured. The intensity of the signal (curve 58) observed with ccw circularly polarised radiation is larger by about 7% relative to that obtained with the cw circularly polarised light (curve 56). This ratio is independent of the primary kinetic energy of the photo-emitted electrons. This result clearly shows a circular dichroism which is consistent with the results obtained in FIG. 2a. In this measurement the electron signal is not spin resolved. It further shows that the work function is independent of the handedness of the light, as expected.

In FIGS. 6a, 6b, 6c, 7a, 7b, 7c, 8a, 8b and 8c, typical results for one preparation are shown for 40 bp, 50 bp, and 78 by monolayers 12 (FIG. 1) of dsDNA on poly-Au substrates 14 (FIG. 1).

Figure 6A:
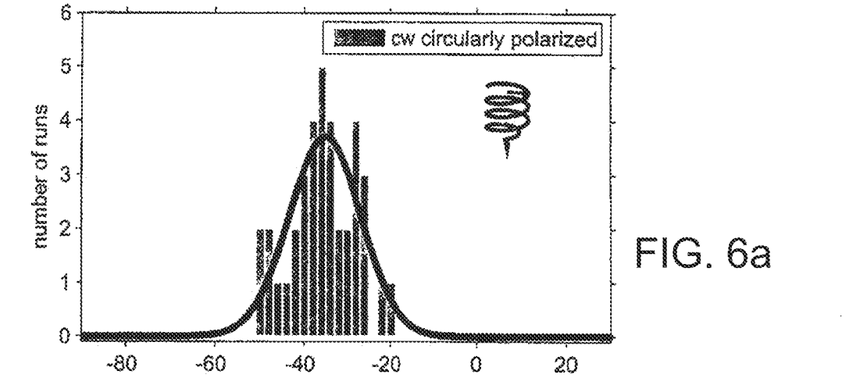
FIGS. 6a, 6b, 6c show a distribution of the spin polarisation percentage of electrons transmitted through a spin filter device comprising a monolayer with molecules of a first length according to an embodiment of the present invention, for light polarised clockwise (cw) circularly, linearly, and counter-clockwise (ccw) circularly, respectively.
Figure 6B:
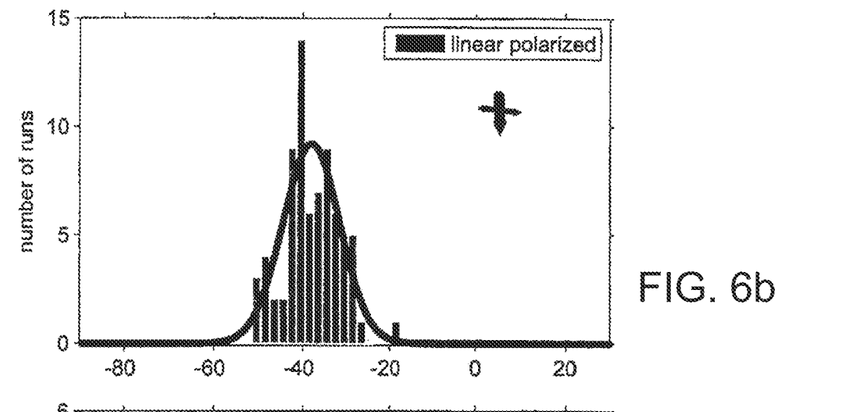
Figure 6C:
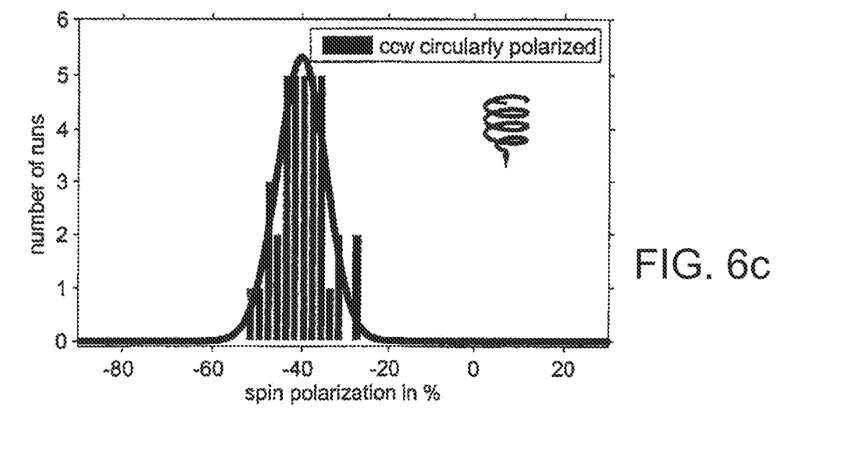

FIGS. 6a, 6b and 6c show measurements of the spin polarisation of 40 bp dsDNA/poly-Au. The spin polarisation is $-(38.0\pm6.5)\%$ for linear polarised light (FIG. 6a), $-(35.1\pm8.3)\%$ for cw polarised light (FIG. 6b), and $-(40.1\pm5.5)\%$ for cw polarised light (FIG. 6c).

Figure 7A:
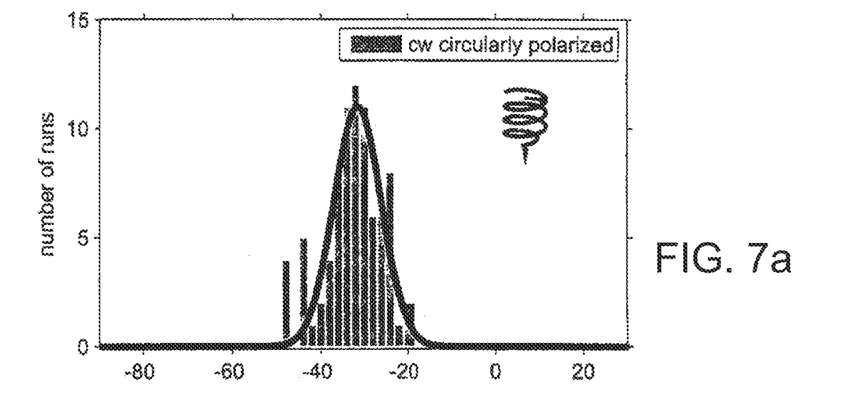
FIGS. 7a, 7b, 7c show a distribution as in FIGS. 6a-6c but for a spin filter device comprising a monolayer with molecules of a second length according to an embodiment of the present invention.
Figure 7B:
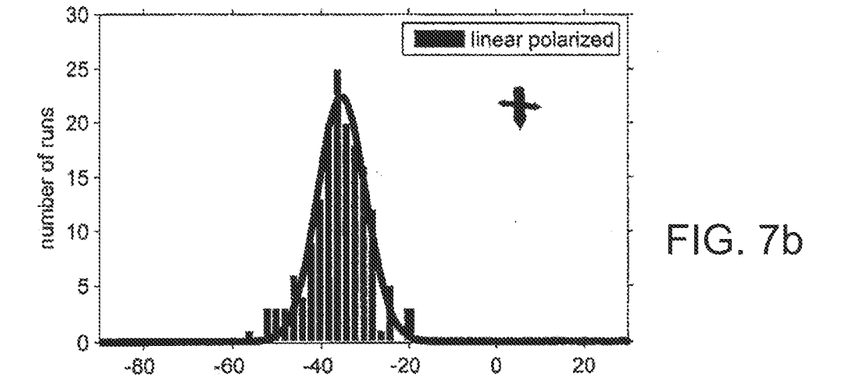
Figure 7C:
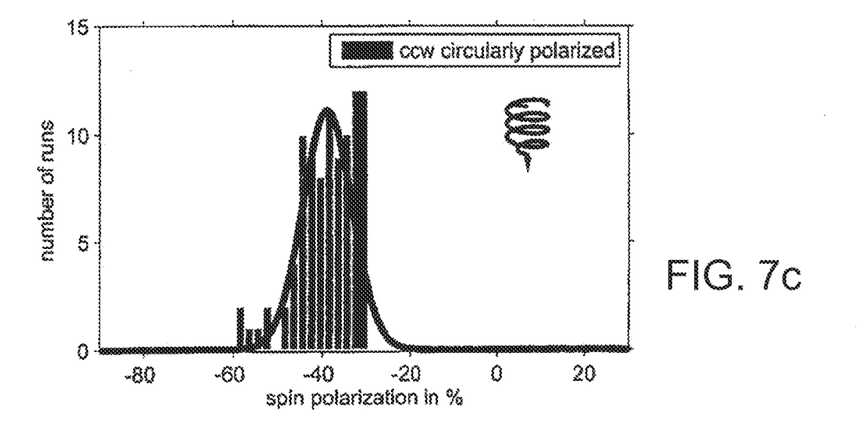

FIGS. 7a, 7b and 7c show measurements of the spin polarisation of 50 bp dsDNA/poly-Au. The spin polarisation is $-(35.5\pm5.5)\%$ for linear polarised light (FIG. 7a), $-(31.5\pm5.7)\%$ for cw polarised light (FIG. 7b), and $-(38.8\pm5.9)\%$ for cw polarised light (FIG. 7c).

Figure 8A:
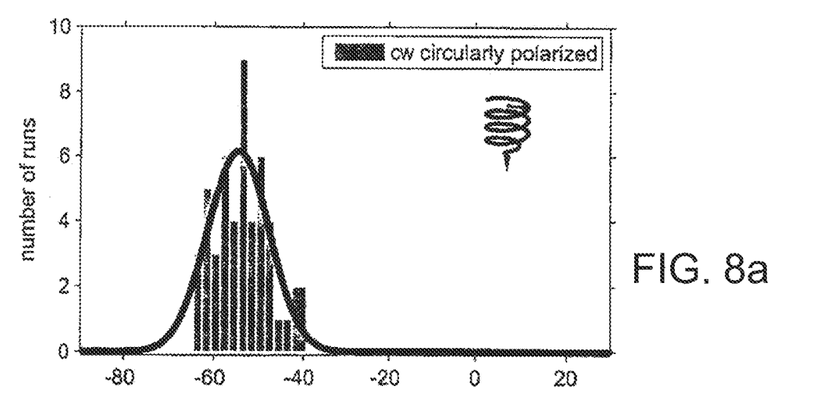
FIGS. 8a, 8b, 8c show another distribution as in FIGS. 6a-6c but for a spin filter device comprising a monolayer with molecules of a third length according to an embodiment of the present invention.
Figure 8B:
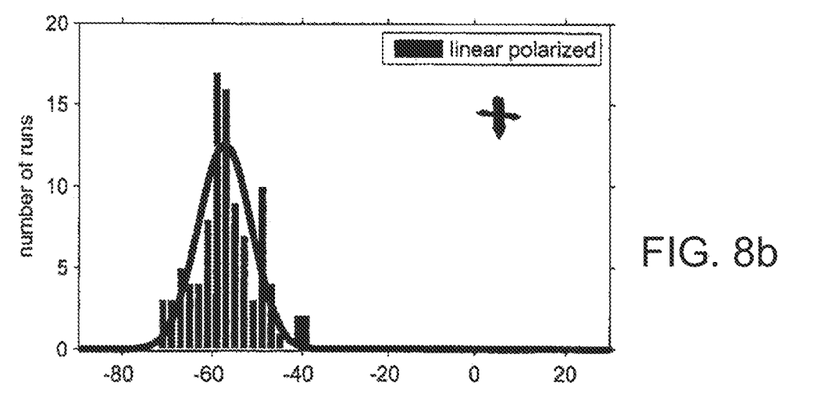
Figure 8C:
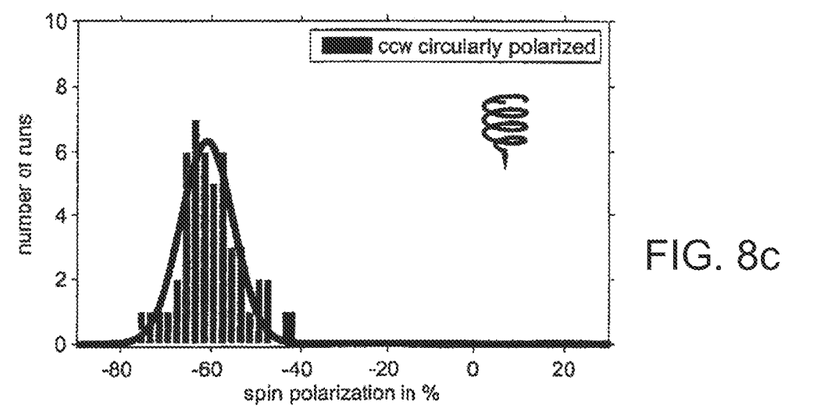

FIGS. 8a, 8b and 8c show measurements of the spin polarisation of 78 bp dsDNA/poly-Au. The spin polarisation is $-(57.2\pm5.9)\%$ for linear polarised light (FIG. 8a), $-(54.5\pm7.0)\%$ for cw polarised light (FIG. 8b), and $-(60.8\pm5.8)\%$ for ccw polarised light (FIG. 8c).

Figure 9:
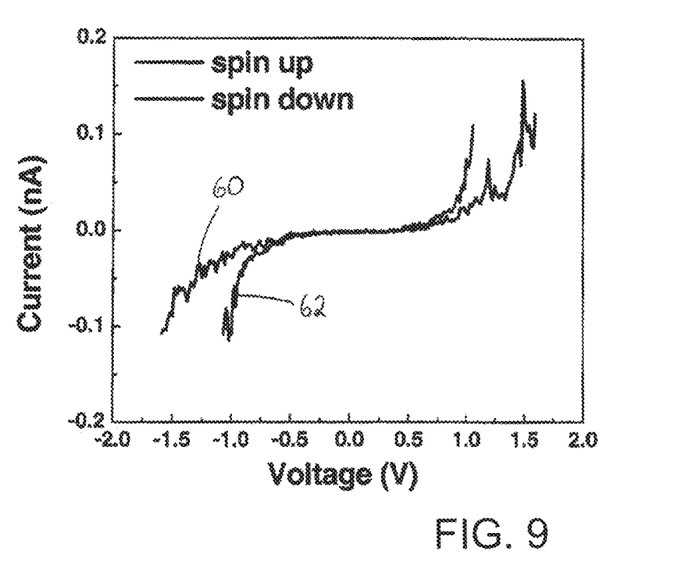
FIG. 9 shows the spin dependent current through a monolayer of the spin filter device according to an embodiment of the present invention.

FIG. 9 shows the spin dependent current through double stranded DNA which is 40 base pairs long. The current of electrons with spin up is shown in curve 60, whereas the current of electrons with spin down is shown in curve 62. At $\pm1$ Volt the ratio between the two spin currents 60, 62 is 1:5, These measurements show that transport through these molecules favours one spin orientation.

Figure 10:
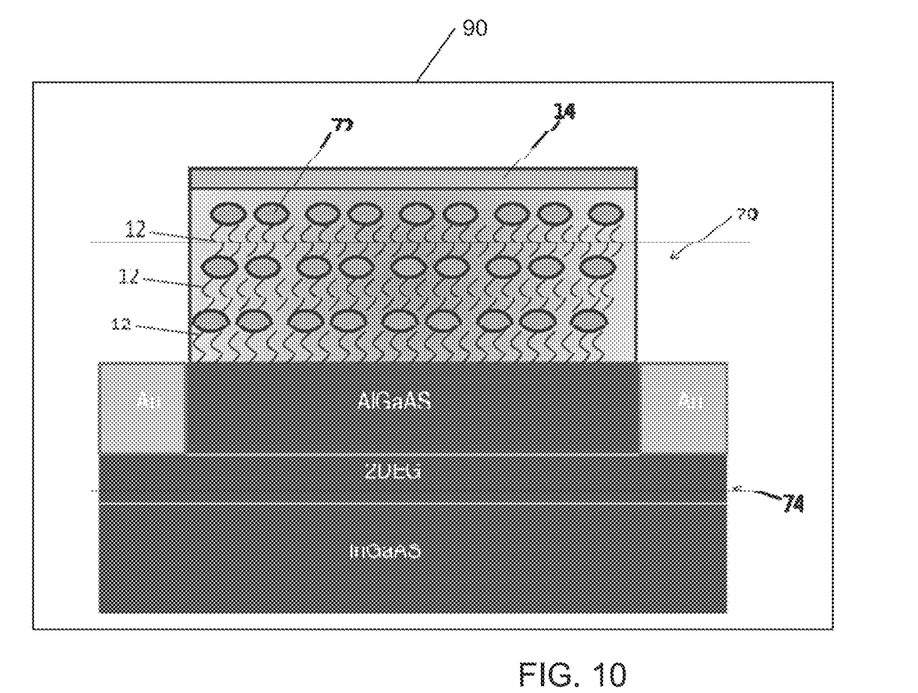
FIG. 10 shows a spintronic transistor structure according to an embodiment of the present invention.

FIG. 10 shows a spintronic transistor structure 70 according to an embodiment of the invention. It comprises three monolayers 12 of organic molecules and nano-dots 72 incorporated between the monolayers 12. The monolayers 12 are self-assembled to the substrate 14 which is made of gold (Au). The spintronic transistor structure 70 is based on a semiconductor structure 74 comprising GaAs. The transistor 70 can create discrete gating for non binary logic operation. By creating several plateaus—like features in the IV characteristics of the transistors 70 a reduction of the power of standard transistors working in non binary base may be obtained.

Figure 11:
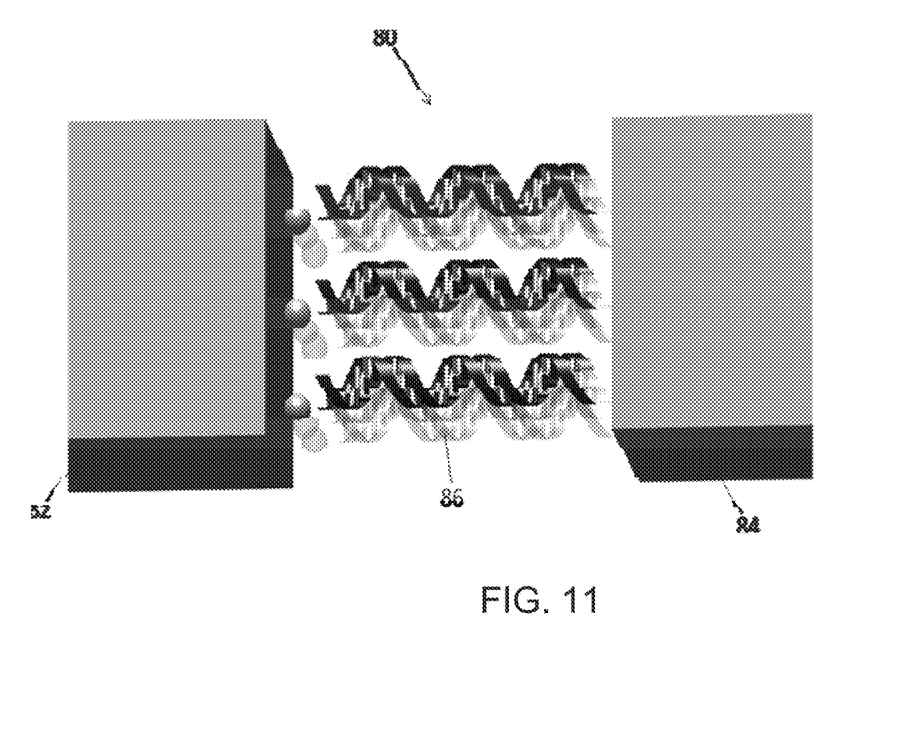
FIG. 11 shows a in filter device according to a further embodiment of the present invention.

In FIG. 11 a spin filter device 80 is shown as an example for a further embodiment according to the present invention. A first substrate 82, e.g. a metal or a semiconductor, acts as source material. A monolayer 86 of asymmetrical molecules, preferably organized chiral molecules is deposited upon the first substrate 82. The first substrate 82 and the monolayer 86 form the spin filter device. A second substrate 84, which can be for example a metal, a semiconductor, an isolator or a vacuum, acts as target material. The monolayer 86 is located between the first and the second substrate 82, 84. Preferably, the monolayer 86 is deposited upon or bounded to the first substrate 82 by self-assembling. Electrons (not shown) travel from the first substrate 84 into the monolayer 86. The majority of those electrons which have passed the monolayer 86 have the same spin. These spin filtered or spin-polarised electrons are injected into the second substrate 84.

The sample organisation for the high spin selectivity is important. Measurements further provide quantitative information regarding the spin polarisation and its dependence on the monolayer thickness or the length of the helical potential. If the effect described in relation to the Figures is caused by a pseudo-magnetic field within the monolayer it means that a field exceeding a few hundred Tesla has to be present.

The present invention provides for practical and theoretical considerations allowing for configuring a novel spin filter device that can be used in spintronic devices. This structure is characterized by spin selectivity for electron transmission therethrough. The spin filter device of the present invention can be used in a spintronic transistor structure.

Those skilled in the art can appreciate that while the present invention has been described in terms of preferred embodiments, the concept upon which the invention is based may readily be utilized as a basis for designing other structures, systems and processes for carrying out the several purposes of the present invention.

In terms of the monolayer 12, it is appreciated that other kinds of asymmetrical and/or chiral molecules than double stranded DNA can be used to achieve the present advantages.

Although the examples of utilization of the spin filter device 10 of the present invention were shown for a spin filter device 80 and as a part of a spintronics circuit, e.g. in large scale integrated circuits or printed circuits, the structure can also be used as components in other detectors (e.g., the detector 90 of FIG. 10) or sensors.

It is important, therefore, that the scope of the invention is not construed as being limited by the illustrative embodiments described herein. Other variations are possible within the scope of the present invention as defined herein.

What is claimed is:

1. A detector for spin-polarised electrons, the detector comprising:
   a substrate;
   at least one monolayer located upon the substrate, wherein an incident light causes electrons to pass the at least one mono-layer; and
   wherein the at least one monolayer comprises chiral molecules and is adapted to filter the electrons such that electrons that exhibit a predetermined spin can pass, independent of polarization of the incident light.

2. The detector of claim 1, wherein the at least one monolayer comprises organic molecules.

3. The detector of claim 1, wherein the at least one monolayer is self-assembled on the detector.

4. The detector of claim 1, wherein the at least one monolayer is self-assembled on the detector in a wet chemical procedure.

5. The detector of claim 1, wherein the at least one monolayer comprises nano-particles.

6. The detector of claim 1, wherein the at least one monolayer comprises nano-dots.

7. The detector of claim 1, wherein the substrate is arranged to be exposed to incident light without requiring the incident light to pass through the at least one monolayer.

8. The detector of claim 7, wherein the substrate is directly exposed to incident light.

9. The detector of claim 1, wherein the at least one monolayer is positioned between the substrate and a semiconductor.

10. The detector of claim 9, wherein the semiconductor includes gallium arsenide or other compound semiconductor.

11. A detector for spin-polarised electrons, the detector comprising:
    a substrate;
    at least one monolayer located upon the substrate, wherein the substrate is exposed to an incident light without requiring the incident light to pass through the at least one monolayer, and wherein the incident light causes electrons to pass the at least one mono-layer; and wherein the at least one monolayer comprises chiral molecules and is adapted to filter the electrons such that electrons that exhibit a predetermined spin can pass.

12. The detector of claim 11, wherein the substrate includes first and second sides, wherein a first side of the substrate is arranged to receive the incident light, and a second side of the substrate is oriented toward the at least one monolayer.

13. The detector of claim 12, wherein the at least one monolayer is positioned between the second side of the substrate and a semiconductor.

14. The detector of claim 11, wherein electrons that exhibit a predetermined spin pass through the at least one monolayer independent of polarization of the incident light.

15. A detector for spin-polarised electrons, the detector comprising:
   a substrate, including a first side oriented to receive an incident light and a second side oriented to eject electrons toward a spin filter in response to the incident light received at the first side of the substrate;
   a spin filter including a plurality of monolayers located upon the second side of the substrate substrate, wherein the plurality of monolayers are arranged parallel with the substrate, and wherein the incident light causes electrons to pass the at least one mono-layer; and
   wherein the plurality of monolayers comprise chiral molecules and are adapted to filter the electrons such that electrons that exhibit a predetermined spin can pass independent of polarization of the incident light.

16. The detector of claim 15, wherein the substrate is exposed to incident light without requiring the incident light to pass through the at least one monolayer.

17. The detector of claim 15, wherein the plurality of monolayers are positioned between the substrate and a compound semiconductor.

18. The detector of claim 17, comprising a compound semiconductor transistor arranged to receive electrons that pass through the spin filter.

* * * * *